United States Statutory Invention Registration [19]

[11] Reg. Number: H520

Johnson et al. [43] Published: Sep. 6, 1988

[54] TECHNIQUE FOR INCREASING OXYGEN INCORPORATION DURING SILICON CZOCHRALSKI CRYSTAL GROWTH

[76] Inventors: David L. Johnson, 349 8th Ave., Bethlehem, Pa. 18018; Robert J. Lavigna, 665 E. Dell Rd., Bath, Pa. 18014; Wen Lin, 4445 Kohler Dr., Allentown, Pa. 18103; Raymond J. Newman, 10 Crusher Rd., Hopewell, N.J. 08525; Subramani Rajaram, 192 Cloverhill Dr., Flanders, N.J. 07836; Joseph C. Veshinfsky, 24 Eisenhower Cir., Whitehall, Pa. 18052; George Williams, 7 Blue Devil La., Mercerville, N.J. 08619

[21] Appl. No.: 805,526

[22] Filed: Dec. 6, 1985

[51] Int. Cl.[4] ..... C30B 15/10

[52] U.S. Cl. ..... 156/617.1; 156/605; 156/620.4; 156/DIG. 64; 156/DIG. 83; 422/248; 373/163

[58] Field of Search ..... 156/617 SP, 617 H, 617 V, 156/DIG. 83; 422/248, 249

[56] References Cited

U.S. PATENT DOCUMENTS

| | | | |
|---|---|---|---|
| 3,002,824 | 10/1961 | Francois | 23/301 |
| 3,198,606 | 8/1965 | Lyons | 23/273 |
| 3,291,574 | 12/1966 | Pierson | 23/301 |
| 3,356,463 | 12/1967 | Ballman et al. | 23/301 |
| 3,679,370 | 7/1972 | Czeck et al. | 23/273 SP |
| 3,698,872 | 10/1972 | Reusser | 23/273 SP |
| 3,870,477 | 5/1975 | Labelle, Jr. | 422/249 |
| 3,953,174 | 4/1976 | LaBelle, Jr. | 156/617 SP |
| 4,000,030 | 12/1976 | Ciszek | 156/617 SP |
| 4,010,064 | 3/1977 | Patrick et al. | 156/DIG. 83 |
| 4,032,390 | 6/1977 | Rice | 422/249 |
| 4,036,595 | 7/1977 | Lorenziwi et al. | 156/617 SP |
| 4,116,642 | 9/1978 | Chu et al. | 422/249 |
| 4,152,194 | 5/1979 | Ciszek et al. | 156/617 SP |
| 4,190,631 | 2/1980 | Dewees et al. | 422/249 |
| 4,238,274 | 12/1980 | Chu et al. | 156/617 SP |
| 4,246,064 | 1/1981 | Dewees et al. | 156/608 |
| 4,268,483 | 5/1981 | Davey et al. | 156/DIG. 83 |
| 4,352,784 | 10/1982 | Lin | 156/DIG. 83 |
| 4,474,641 | 10/1984 | vanRun | 256/617 SP |
| 4,497,777 | 2/1985 | Kojima | 422/249 |
| 4,545,849 | 10/1985 | d'Aragowa | 156/617 SP |
| 4,563,976 | 1/1986 | Foell et al. | 156/617 SP |

FOREIGN PATENT DOCUMENTS

| | | | |
|---|---|---|---|
| 658110 | 1/1965 | Belgium | 156/DIG. 83 |
| 1222903 | 5/1962 | Fed. Rep. of Germany | 156/617 SP |
| 1194820 | 6/1965 | Fed. Rep. of Germany | 156/617 SP |

*Primary Examiner*—John F. Terapane
*Assistant Examiner*—Eric Jorgensen

[57] ABSTRACT

A glass crucible (30) for containing a material from which a silicon crystal melt is produced, wherein the inside surface area of the crucible is increased to react with the silicon melt (31) to increase the oxygen content thereof. The inside surface area may be increased by incorporating inwardly directed silica ribs (40) or concentric, hollow silica cylinders (32) as well as forming corrugations (45) or undulations on the inside surface thereof.

18 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

TECHNIQUE FOR INCREASING OXYGEN INCORPORATION DURING SILICON CZOCHRALSKI CRYSTAL GROWTH

TECHNICAL FIELD

The invention relates to techniques for growing single crystal silicon ingots, having high oxygen concentration, from molten silicon material contained in a fused silica crucible.

BACKGROUND OF THE INVENTION

It is conventional to grow single crystal silicon ingots by preparing a melt of the silicon material, and contacting the surface of the melt with a previously prepared seed crystal of the silicon material of the desired crystalline lattice orientation. The seed crystal is then withdrawn from the melt at a rate of approximately a few inches per hour, while the crystal and the melt are counter-rotated with respect to each other.

Typically, the chamber in which the crystal ingot is grown is first evacuated and then backfilled to a lower than atmospheric pressure with a continuing flow of gas, such as argon, which serves as the ambient during the crystal growth. The lower than atmospheric pressure of the gas aids in minimizing the formation of undesired contaminants in the system during the growth. With this technique, commonly known as the Czochralski process, crystals several feet in length and several inches in diameter are routinely grown.

Oxygen in the semiconductor crystals is essential for internal gettering of impurities upon precipitation (e.g., $SiO_2$) during device processing. The source of the oxygen is the fused silica crucible used to contain the silicon melt in the Czochralski process. The incorporation level of oxygen in silicon is a function of, among other things, the crucible dissolution rate. Different levels of oxygen concentrations are required for different device processing, depending on the nature of the particular device fabrication process. For example, bipolar processing requires higher oxygen concentrations than MOS processing. Control of crucible dissolution by the crucible rotation rate is an effective method of controlling the oxygen level in the melt. Accelerated and decelerated crucible rotation is effective to enhance oxygen incorporation in many cases. Such motion increases the mass transfer between the wetted walls of the crucible and the melt. Therefore, the available wetted inner surface area of the crucible and the relative motion between the crucible and the melt are important factors associated with oxygen incorporation. At present, using the ASTM-80 standard, the amount of oxygen incorporation is in the range of 12–18 ppma with the bulk of the crystal ingot grown in the 12–16 ppma range However, certain material codes require a higher range of oxygen content, for example, 17–22 ppma Therefore, there is a need for substantially increasing the level of oxygen incorporation in the grown crystal billet.

SUMMARY OF THE INVENTION

The foregoing need is met with a silica crucible for containing a silicon melt from which a single crystal ingot is grown, wherein the crucible has means which provide an inside wetted surface area-to-melt volume ratio that results in elevated oxygen concentration in the melt due to reactions between the melt and the wetted inside surface of the crucible as compared with a crucible of equal average radius, but having a regular cylindrical inner surface as shown in FIG. 1 and rotated at the same speed during crystal growth. As used herein, the elevated oxygen concentration shall refer to an oxygen concentration elevated with respect to such a comarision with a prior art crucilble of the type shown in FIG. 1.

DETAILED DESCRIPTION

Figure 1:
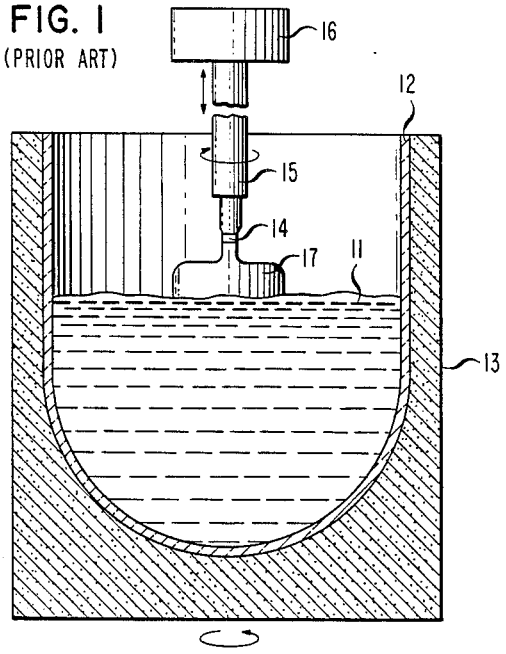
FIG. 1 (PRIOR ART)
FIG. 1 depicts known Czochralski growing apparatus.

With reference to FIG. 1 there is shown, in cross-section, a quantity of molten silicon 11, termed a "melt," confined in a fused quartz crucible 12. A standard crucible 12 is surrounded and supported by a thermally conductive, radiation-absorbing housing 13.

Housing 13 typically is made of graphite, and, in the art, is generally termed a "susceptor" for historical reasons or more recently "graphite crucible". In early crystal growers, heating was provided primarily by radio frequency heating and the housing 13 operated as a susceptor to convert the radio frequency energy into thermal energy. However, with the use of larger masses of molten materials as the art progressed, radio frequency heating was largely supplanted by electrical resistance heating, with radiation heating of the "susceptor" or "graphite crucible". Conventional heating arrangements, including electrical resistance heating, may be used in accordance with this invention.

In operation, referring to FIG. 1, a seed crystal 14 is held on the end of a seed shaft 15, which in turn is supported by a mechanism 16, capable of rotating and moving the shaft vertically. The free end of the seed 14 is touched to the surface of the molten material 11 as the crucible 12 and the seed shaft 15 are counter-rotated, i.e., in opposite directions. As can be seen in FIG. 1, such prior art crucible has a regular cylindrical wall without any protrusions, extending members, corrugations or convoluted shape to increase the wetted surface area in contact with the melt. Similarly, these were no other protrusions or members within the prior art crucible to provide additional wetted surfaces.

After the seed crystal 14 is touched to the surface of the molten material 11, and provided that the temperature and other conditions known to those in the art are proper, the molten material solidifies on the seed crystal 14 with the same lattice orientation as the seed crystal. By slowly withdrawing the seed crystal, typically at the rate of a few inches per hour, and rotating the seed shaft 15 and seed crystal 14 affixed thereto, a single crystalline ingot 17 is formed from the molten material.

Operation of at least one type of Czochralski-type crystal grower is described in U.S. Pat. No. 3,679,370, issued July 25, 1972 to J. J. Czeck et al. and further details of that operation may be found in U.S. Pat. No. 3,698,872, issued Oct. 17, 1972, to R. E. Reusser, both of which are incorporated by reference herein.

As hereinbefore indicated, at the melt temperature (e.g., 1450° C.), a reaction takes place between the molten silicon and the inside surface of the fused silica crucible which yields a source of oxygen which is incorporated in the growing ingot 17. The amount of oxygen incorporation based upon the standard crucible is in the range of 12–18 ppma with the bulk of the crytal grown in the 12–16 ppma range. However, certain semiconductor codes require higher ranges of oxygen content, for example, 17–22 ppma.

Figure 2:
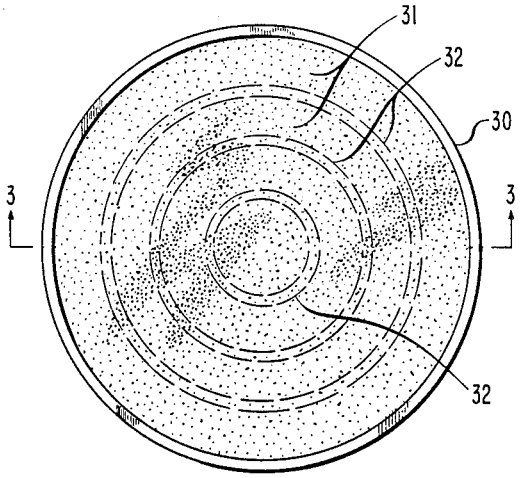
FIGS. 2 and 3 are top and cross-sectional views, respectively, of the crucible of the instant invention.
Figure 3:
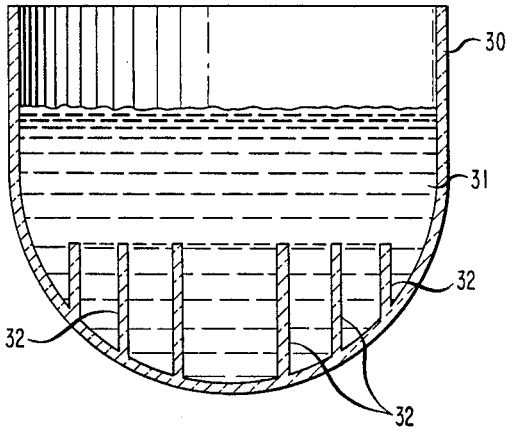

The use of crucibles of the instant invention provides such elevated oxygen content in the melt as well as in the grown crystalline ingot by increasing the wetted surface area of the $SiO_2$ crucible wetted by the melt for a crucilble having a given effective radius. This, in turn, increases the wetted surface area to melt-volume ratio. FIGS. 2 and 3 show a top and cross-sectional view, respectively, of an exemplary crucible 30 used to contain a melt 31. Projecting upward a substantial distance into the melt from and integral with the bottom of the crucible 30 is a plurality of hollow, concentric cylinders 32—32. Such cylinders 32—32 are made of the same material as the crucible 30 (i.e., silicon dioxide) to provide additional surface area which provides a source of oxygen for the melt 31 and the ingot 17 drawn therefrom by increasing the inside surface area-to-melt volume ratio.

Although the exemplary embodiment shown in FIGS. 2 and 3 makes use of three concentric cylinders 32 the instant invention is not so limited. In a working embodiment a single cylinder 32 proved effective for growing an ingot 17 having desirable high oxygen concentrations. The crucible 30 in that embodiment was an arc fused quartz crucible having a single quartz cylinder 32 and charged with 30 kilograms of silicon. The crucible 30 was a standard size having an inside diameter of 13.5 inches and a height of 11.024 inches and the melt height was 6.16 inches. A single upstanding, hollow, quartz cylinder 32 integrally affixed to the inside bottom surface had an inside diameter of 12 inches and a height of 2.32 inches. The wetted inside surface area-to-melt volume ratio of the standard crucible without the cylinder 32 was 0.459 $inch^{-1}$ while that ratio, with the cylinder therein, was 0.658 $inch^{-1}$. Following meltdown, a 25 inch long, 100 mm diameter ingot was grown with a freeze developing as the melt level dropped below the top of the quartz ring 32.

Figure 4:
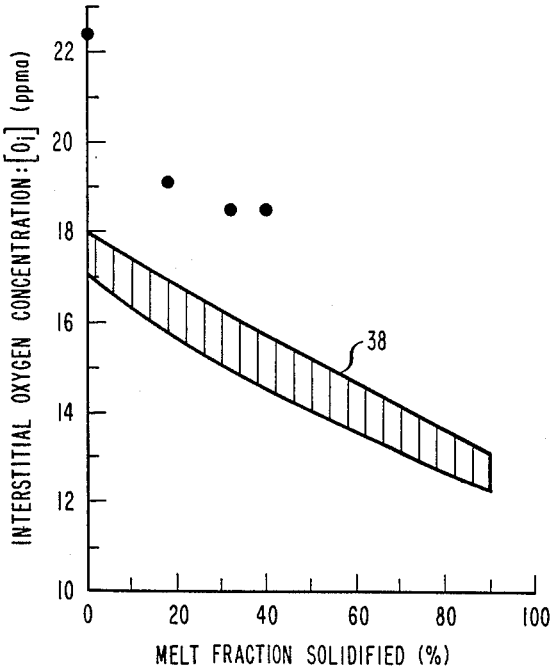
FIG. 4 is a graph showing the interstitial oxygen content of the instant crucible as well as prior art results.

Upon removal from the grower, slugs (2–6 mm thick) were cut from the ingot 17 and oxygen data was obtained. The interstitial oxygen concentration data for the ingot 17 grown using the single cylinder 32 approach (see solid dots in FIG. 4) is plotted along with a band 38 of data (vertically lined area) that represents the highest previously attained oxygen concentration levels using the previously described acceleration and deceleration techniques. Clearly, the instant technique provides substantially higher oxygen concentration than heretofore attained.

Figure 5:
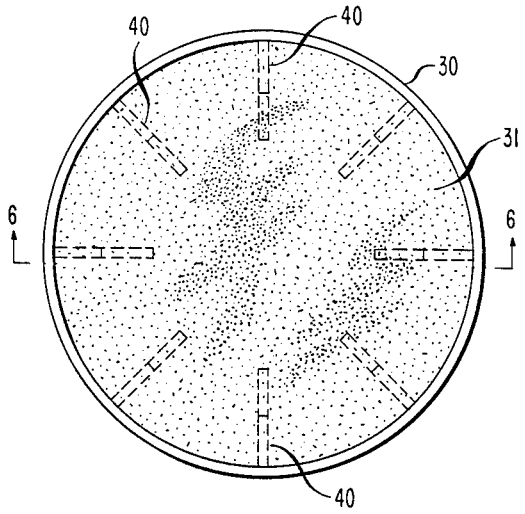
FIGS. 5 and 6 are top and cross-sectional views of a ribbed crucible.
Figure 6:
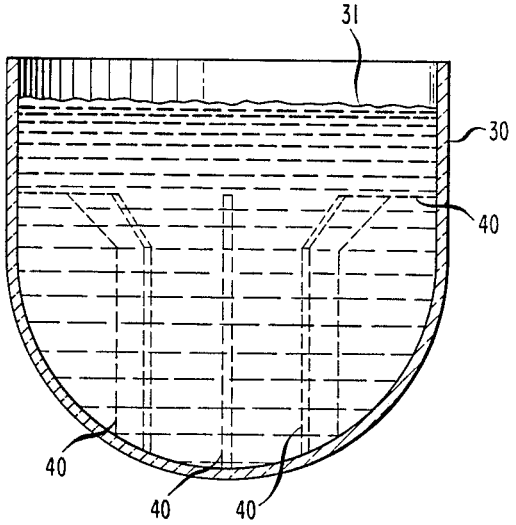

An additional exemplary embodiment in which the inside wetted surface area of the crucible 30 is increased as compared with the prior art, regular cylindrical crucible, shown in FIG. 1 is shown in the top and cross-sectional view of FIGS. 5 and 6, respectively. A plurality of internal fused silica ($SiO_2$) ribs 40 is integrally incorporated in the crucible 30 and extends along a substantial length of the crucible. The ribs 40 not only increase the internal wetted surface area of the crucible 30 to provide an additional source of oxygen but also promote circulation of the melt 30 towards the central portion of the melt where the growing of the ingot 17 takes place. A drawback to this design is that the increased wetted quartz surface area is reduced as the melt level falls which decreases the oxygen incorporation in the melt.

Figure 7:
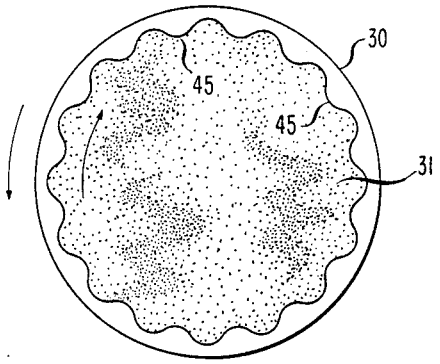
FIGS. 7–10 depict various geometries of crucibles incorporating the instant invention.
Figure 8:
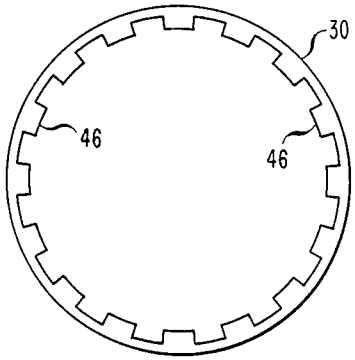
Figure 9:
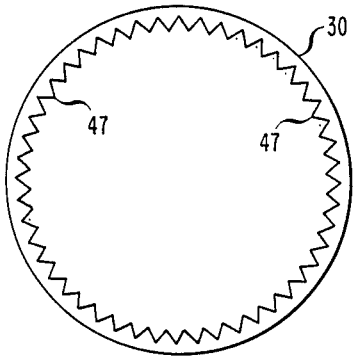
Figure 10:
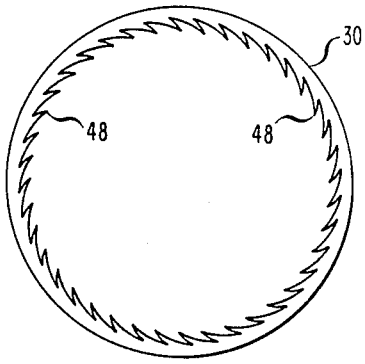

As hereinbefore indicated one known technique for enhancing the oxygen incorporation of the melt is accelerated and decelerated rotation of the crucible 30. Such motion enhances the friction between the silicon melt and the inside surface of the wall of the crucible 30. To further enhance the friction and increase the inside surface area to elevate the oxygen incorporation, another exemplary embodiment of the invention is shown in the top view of FIG. 7 which shows the inside wetted surface of the crucible 30 with corrugations 45. The shape of the corrugations 45 is not critical as they can be semicircular, elliptical or the like. Rectangular 46, triangular 47 or sawtooth 48 corrugations as shown in the partial views of FIGS. 8, 9 and 10, respectively, are also considered within the scope of the instant invention. Such corrugations, as shown in FIG. 12, also extend along a substantial length of the crucible.

Figure 11:
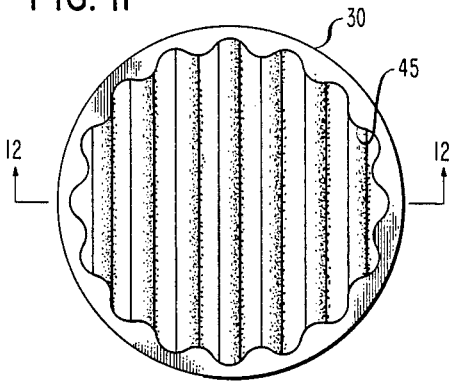
FIGS. 11 and 12 are top and cross-sectional views, respectively, of a crucible having corrugations on the side and bottom surfaces thereof.
Figure 12:
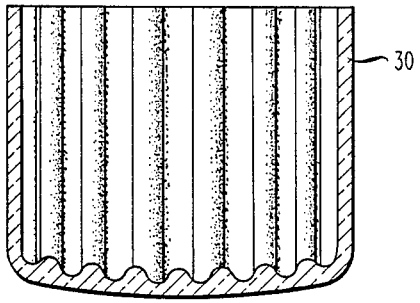
Figure 13:
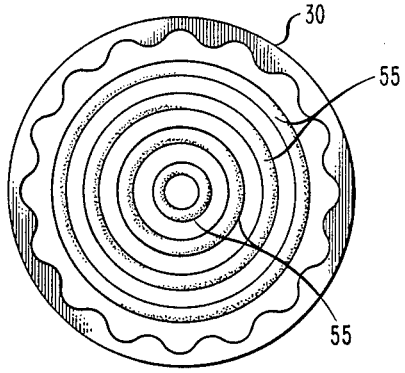
FIG. 13 depicts a crucible having corrugated sides and concentric undulations on the bottom surface thereof.

FIGS. 11 and 12 depict top and cross-sectional views, respectively, of a crucible 30 having corrugations 45 on the bottom as well as the sides thereof. Alternatively, the bottom surface could have a plurality of concentric undulations or protrusions 55 as shown in FIG. 13.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A silica crucible for containing a silicon melt from which a single crystal ingot is grown during rotation of the crucible, wherein the crucible has an element extending along a substantial portion of the crucible length to provide an inside wetted surface area-to-melt volume ratio that results in elevated oxygen concentration in the melt due to reactions between the melt and the crucibles inside wetted surface as compared with a cricible of equal average radius rotated during crystal growth at the same rate but absent such element.

2. The crucible as set forth in claim 1, wherein: said element comprises corrugations extending along the inside walls thereof.

3. The crucible as set forth in claim 2, wherein: the corrugations are substantially rectangular in cross section.

4. The crucible as set forth in claim 2, wherein: the corrugations are substantially triangular in cross section.

5. The crucible as set forth in claim 2, wherein: the corrugations are of a substantially sawtooth geometry in cross section.

6. The crucible as set forth in claim 1, wherein the oxygen level of the melt is greater than 17 ppma.

7. The crucible as set forth in claim 1, wherein:

said element comprises at least one upstanding, hollow, silica cylinder integrally affixed on the bottom portion of the crucible.

8. The crucible as set forth in claim 1, wherein:

said element comprises a plurality of concentric, upstanding, hollow silica cylinders integrally affixed to the bottom portion of the crucible.

9. The crucible as set forth in claim 1, wherein:

said element comprises a plurality of inwardly directed silica ribs affixed to the inside surface of the crucible.

10. A method of forming a single crystal ingot, having an elevated oxygen content, comprising:

growing the ingot from a melt contained in a silica crucible having element extending along a substantial length of the crucible to provide an inside wetted surface area-to-melt volume ratio that results in elevated oxygen concentration in the melt due to reactions between the melt and the inside surface of the crucible.

11. The method as set forth in claim 10, wherein:

said element comprises corrugations therein.

12. The method as set forth in claim 11, wherein:

the corrugations are substantially rectangular in cross section.

13. The method as set forth in claim 11, wherein:

the corrugations are substantially triangular in cross section.

14. The method as set forth in claim 11, wherein:

the corrugations are of a substantially sawtooth geometry in cross section.

15. The method as set forth in claim 10, wherein the oxygen level of the melt is greater than 17 ppma.

16. The method as set forth in claim 10, wherein:

said element comprises at least one upstanding, hollow, silica cylinder integrally affixed on the bottom portion of the crucible.

17. The method as set forth in claim 10, wherein:

said element comprises a plurality of concentric, upstanding, hollow silica cylinders integrally affixed to the bottom portion of the crucible.

18. The method as set forth in claim 10, wherein:

said element comprises a plurality of inwardly directed silica ribs affixed to the inside surface of the crucible.

* * * * *